United States Patent [19]

Block et al.

[11] Patent Number: 5,021,400

[45] Date of Patent: Jun. 4, 1991

[54] POWDER CONTAINING THALLIUM, CALCIUM, BARIUM AND COPPER

[75] Inventors: Jacob Block, Potomac; Leonard E. Dolhert, Clarksville, both of Md.

[73] Assignee: W. R. Grace & Co.-Conn., New York, N.Y.

[21] Appl. No.: 423,718

[22] Filed: Oct. 17, 1989

Related U.S. Application Data

[63] Continuation of Ser. No. 188,926, May 2, 1988, abandoned.

[51] Int. Cl.$^5$ .................. H01B 12/00; H01B 1/06; H01L 39/12
[52] U.S. Cl. .................................. 505/1; 252/521; 423/604; 423/624; 423/635; 502/525; 505/737; 505/734; 505/783; 501/123
[58] Field of Search ............ 252/521; 423/604, 624, 423/635; 502/525; 505/737, 734, 783; 501/123

[56] References Cited

U.S. PATENT DOCUMENTS

| | | | |
|---|---|---|---|
| 3,373,119 | 3/1968 | Krystniak | 423/593 |
| 3,796,793 | 3/1974 | Metzer et al. | 423/593 |
| 4,049,789 | 9/1977 | Manabe | 423/593 |
| 4,318,995 | 3/1982 | Rhodes et al. | 423/593 |
| 4,567,031 | 1/1986 | Riley | 423/593 |
| 4,649,037 | 3/1987 | Marsh et al. | 423/628 |
| 4,804,649 | 2/1989 | Sherif | 252/518 |
| 4,962,083 | 10/1990 | Hermann et al. | 501/123 |

FOREIGN PATENT DOCUMENTS 0303249 2/1989 European Pat. Off.

OTHER PUBLICATIONS

Torardi, "Crystal Structure of Tl$_2$Bu$_2$Ca$_2$Cu$_3$Ox..." Science, vol. 240, Apr. 29, 1988, pp. 631-634.
Wu, "A new method for the preparation of..." Mater. Lett. 7(5-6) 1988 (Abstract only), pp. 169-171.
Sheng et al., "Superconductivity at 90K in the Tl-Ba-Cu-O System", Phys. Rev. Lett., vol. (60), No. 10, 3/7/88, pp. 937-940.
Bordia et al., "Sintering and Microstructure-Property Relations for YBa$_2$Cu$_3$O$_x$", High-Temp. Superconductors Symposium held 11/30-12/4/87, pp. 245-248.
Uchida, "High Temperature Superconductivity of La-Ba-Cu Oxides", Jap. Jnl. of Appl. Physics, vol. 26(1), 1/87, pp. L1-L2.
C. E. Rice, "Preparation of superconducting thin films of . . ." Appl. Phys. Lett., 51(22), Nov. 30, 1987, pp. 1842-1844.
Vilminot, "Synthesis and Characterization of YBa$_2$Cu$_3$O$_{1-x}$..." Mat. Res. Bull., vol. 23, 1988, pp. 521-529.
Marcilly et al., "Preparation of Highly Dispersed Mixed Oxides and Oxide Solid Solutions by Pyrolysis of Amorphous Organic Precursors", Jnl. of the Amer. Cer. Society, vol. 53(1), 1/70, pp. 56-57.
Melling et al., "Powder preparation and thermal properties of 1-2-3 YBaCu Oxide Superconductor", Preprint to be published in Advances in Cryogenic Eng., vol. (34), Presented at Internat'l. Cryogenic Mat'ls. Con., Jun. 14-18, 1987.
Kudas et al., Aerosol Flow Reactor Production of Fine Y Ba$_2$Cu$_3$O$_7$ Powder Fabrication of Superconducting Ceramics, High Temperature Super Conductors II, D. W. Capone editor, Materials Research Society, Apr. 5-9, 1988, pp. 367-369.
Nasu et al., Ba$_2$YCu$_3$O$_x$ Films Propared by Pyrolysis of Organic or Inorganic Salts, High Temperature Superconductors II, D. W. Capone et al., Editor, Materials Research Society, Apr. 5-9, 1988, pp. 101-104.
Rice et al., Preparation of Superconducting Thin Films of Ba$_2$YCu$_3$O$_7$ by a Novel Spin-On Pyrolysis Technique, Applied Physics Letters 51 (22), Nov. 30, 1987, pp. 1842-1844.
Rice et al., Superconducting Thin Films of High Tc Cuprates Prepared by Spin On Pyrolysis, American Vacuum Society, Series 3, Thin Film Process Ng & Characterization of High Temperature Superconductory, Nov. 6, 1987, pp. 198-203.
Wu et al., Superconductivity at 93 K in a New Mixed Phase Y-Ba-CuO Compound System at Ambient Pressure, Phys. Rev. Lett., 58, 908-910 (Mar. 2, 1987).
Engler et al., Superconductivity above Liquid Nitrogen Temperature: Preparation and Properties of a Family of Perovskite-Based Superconductors, J. Am. Chem. Soc., 109, 2848-2849 (1987).
Wang et al., Comparison of Carbonate, Citrate, and Oxalate Chemical Routes to the High-Tc Metal Oxide Superconductors La$_{2-x}$Sr$_x$CuO$_4$, Inorg. Chem 26, 1474-1476 (1987).
Bednorz, J. G. et al., Possible HIgh Tc Superconductivity in the Ba-La-Cu-O System, Zeit. Phy. B., 64, 189-193 (1986). (English translation).
Sheng, Z. Z. et al., Superconductivity in the Rare Earth-Free Tl-Ba-Cu-O System above Liquid Nitrogen Temperature, Nature, 332, 55-58 (1988).
Sheng, Z. Z. et al., Bulk Superconductivity at 120 K in the Tl-Ca-Ba-Cu-O System, Nature, 332, 138-139 (1988).
Hazen et al., 100 K Superconducting Phases in the Tl-Ca-Ba-Cu-O System, Phys. Rev. Lett., 60, 1657-1660 (1988).
"Nota Bene", High Tc Update, vol. 2, No. 6, p. 1, Mar. 15, 1988.

(List continued on next page.)

Primary Examiner—Paul Lieberman
Assistant Examiner—John Boyd
Attorney, Agent, or Firm—William W. McDowell, Jr.; Edward J. Cabic; Steven Capella

[57] ABSTRACT

Improved process for making Tl-Ca-Ba-CuO superconductors. A solution of the monocarboxylates (e.g., acetates) of Ca, Ba, and Cu is dried, calcined, mixed with Tl$_2$O$_3$, and the mixture is heated to make a superconductor. The method minimizes introduction of contaminants. Novel compositions result.

3 Claims, No Drawings

OTHER PUBLICATIONS

Gao, L. et al., Bulk superconductivity in $Tl_2CaBa_2Cu_2O_{8+\delta}$ up to 120 K, *Nature*, 623–624 (Apr. 14, 1988).

Michel, C. et al., Oxygen intercalcalation in mixed valence copper oxides related to the perovskites, *Rev. de Chim. Minerale*, t. 21, 407–425 (1984).

Voigt, J. A. et al., A Hydroxycarbonate Route to Superconductor Precursor Powders, paper available at Fall meeting of Materials Research Society, Boston late Nov. 1987.

Sheng, Z. Z. et al., Superconductivity above 90 K in the Tl-Ba-Cu-O System; copy of typescript of paper, date uncertain.

Hermann, A. M. et al., Melt-processible rare earth-Ba-Cu-O superconductors based on molten Ba-Cu oxides, *Appl. Phys. Lett.*, 51, 1854–1856 (Nov. 30, 1987).

Cava, R. J., et al., Bulk Superconductivity at 91 K in Single-Phase Oxygen Deficient Perovskite $Ba_2YCu_3O_{9-\delta}$, *Phys. Rev. Lett.*, 58, 1676–1679 (Apr. 20, 1987).

Nguyen, Ninh, et al., Oxygen Defect $K_2NiF_4$-Type Oxides: The Compounds $La_{2-x}Sr_xCuO_{4-x/2+\delta}$, *Jour. Solid State Chem.*, 39, 120–127 (1981).

Nguen, N. et al., Oxydes Ternaires de Cuivre a Valence Mixte de Type $K_2NiF_4$ Deficitaires en Oxygene: Evolution Progressive d'un Etat Semi-conducteur vers un Etat Semi-metallique Des Oxydes $La_{2-x}Sr_xCuO_{4-x/2+\delta}$, *J. Phys. Chem. Solids*, 44, 389–400 (1983).

Shaplygin, I. S. et al., Preparation & Properties of the Cmpds. $Ln_2CuO_4$ (Ln=La, Pr, Nd, Sm, Eu, Gd), *Russ. J. Inorg. Chem.*, 24, 1478–1485 (1979) (English).

Wu, Nae-Lih and Ruckenstein, Eli, "A New Method for the Preparation of the Superconducting $Tl_2CaBa_2Ca_2O_8$ Compound", *Materials Letters*, vol. 7, No. 5, Nov. 6, 1988, pp. 169–171.

![](POWDER CONTAINING THALLIUM, CALCIUM, BARIUM AND COPPER)

POWDER CONTAINING THALLIUM, CALCIUM, BARIUM AND COPPER

This is a continuation of application Ser. No. 188,926, filed May 2, 1988, now abandoned.

FIELD OF THE INVENTION

This invention relates to the preparation of superconducting ceramics and more particularly to an improvement in preparing the metal oxide system known as Tl-Ca-Ba-Cu-O.

SUMMARY OF THE INVENTION

A solution of the monocarboxylates of Ca, Ba, and Cu is prepared. The solvent is removed by drying by conventional means. The dried mixed monocarboxylates are calcined. The calcined product is mixed with $Tl_2O_3$ and the mixture is heated. The result is superconducting. $Tl_2O_3$ is one of the least volatile Tl compounds, and the delayed addition of Tl as the oxide avoids volatility problems of the Tl monocarboxylate and reduces toxicity problems.

BACKGROUND OF THE INVENTION

It has long been known that the effective resistivity of certain metals was sometimes substantially eliminated when the metal was exposed to low temperature conditions. Of particular interest were the metals and metal oxides which can conduct electricity under certain low temperature conditions with virtually no resistance. These have become known as superconductors. Certain metals, for example, are known to be superconductive when cooled to about 4° on the Kelvin scale (°K.), and certain niobium alloys are known to be superconductive at about 15° K., some as high as about 23° K.

Discovery of superconductivity in the system La-Ba-Cu-O (J. G. Bednorz and K. A. Muller, *Zeit. Phys. B* 64, 189–193 [1986]) and in the system Y-Ba-Cu-O (Wu et al, *Phys. Rev. Lett.* 58, 908–910 [1987]) has stimulated the search for other systems, particularly with a view to substituting other elements for the rare earths (RE) used in the earlier materials. For example, replacement of RE by Bi and Tl has been reported (papers in press). In preparing the system Tl-Ba-Cu-O, Z. Z. Sheng and A. M. Hermann (Superconductivity in the Rare Earth-Free Tl-Ba-Cu-O System above Liquid Nitrogen Temperature) (communication from the authors), first mixed and ground $BaCO_3$ and CuO to obtain a product which they heated, then intermittently reground to obtain a uniform black Ba-Cu-Oxide powder, which was then mixed with $Tl_2O_3$, ground, and heated, with formation of a superconducting material. It was noted that the Tl oxide partially melted and partially vaporized.

The superconductor system Tl-Ca-Ba-Cu-O was also reported in a paper by Sheng and Hermann, "Bulk Superconductivity at 120K in the Tl-Ca-Ba-Cu-O System" (communication from the authors). The authors reported "stable and reproducible bulk superconductivity above 120K with zero resistance above 100K". According to the paper the composition was prepared by mixing and grinding together $Tl_2O_3$, CaO, and $BaCu_3O_4$. The ground mixture was pressed into a pellet and heated in flowing oxygen. The result was cooled and found to be superconducting.

Our invention is an improvement in the latter Sheng-Hermann process of making Tl-Ca-Ba-Cu-O superconductors.

See also the paper by Hazen et al, "100K Superconducting Phases in the Tl-Ca-Ba-Cu-O System" (communication from the authors) which refers to two superconducting phases, $Tl_2Ca_2Ba_2Cu_3O_{10+}\delta$ and $Tl_2Ca_1Ba_2Cu_2O_{8+}$, both with onset $T_c$ near 120K and zero resistivity at 100K. Preparation included grinding together $Tl_2O_3$, CaO, and $BaCu_3O_4$ (or $Ba_2Cu_3O_5$), followed by heating.

And see "Nota Bene" in *High $T_c$ Update*, vol. 2, No. 6, p. 1, Mar. 15, 1988, further re properties of the Tl-Ca-Ba-Cu-O system.

DETAILED DESCRIPTION OF THE INVENTION

Our invention is applicable generally to the system $Tl_a$-$Ca_b$-$Ba_c$-$Cu_d$-$O_e$, where a, b, and c are independently about 0.5–3, preferably 1 or 2; d is about 1–4, preferably 2 or 3; and e is indeterminate, depending on the mixture. Such compounds include:

A. $Tl_2$-$Ca_2$-$Ba_2$-$Cu_3O_{10+}$
B. $Tl_2$-$Ca_1$-$Ba_2$-$Cu$-$O_{8+}$
C. $Tl_1$-$Ca_1$-$Ba_1$-$Cu_2$-$O_x$;
D. $Tl_1$-$Ca_3$-$Ba_1$-$Cu_3$-$O_x$; and the like.

In the above, A is made in Example 3. C has been suggested as the component that provides actual superconductivity. ("Nota Bene", in *High $T_c$ Update*, op. cit.) The indicator "delta" follows the art convention and designates an undetermined value of 1 or less.

The invention provides several novel compositions and processes:

Compositions (1) Solution of monocarboxylates of Ca, Ba, and Cu. Total solids (monocarboxylates) is about 5–25 weight % of solution, and Ca, Ba, and Cu are present in an atomic ratio of $Ca_b$-$Ba_c$-$Cu_d$, where b is about 0.5–3, c is about 0.5–3, and d is about 1–4.

(2) The dried homogeneous mixture of the monocarboxylates of Ca, Ba, and Cu.

(3) The homogeneous mixture of the oxides of Ca, Ba, and Cu.

(4) The unfired mixture of 3 above, viz., the homogenized Ca, Ba, and Cu oxides, plus $Tl_2O_3$, providing $Tl_a$-$Ca_b$-$Ba_c$-$Cu_d$-O where a is about 0.5–3 and b, c, and d are as above defined.

(5) The fired mixture of 4 above (superconductor).

Comment

The point of novelty of Composition 5 vis-a-vis the prior art is that the Ca, Ba, and Cu oxides are present in totally homogenized form in Composition 5, owing to their formation from the original homogeneously dispersed monocarboxylates.

Processes (6) Forming a solution of monocarboxylates of Ca, Ba, and Cu, suitably to provide an atomic ratio of $Ca_b$-$Ba_c$-$Cu_d$ as above defined.

(7) Drying (6). Drying can be done in an oven (cf. our Example 1), or (preferably) by spray drying, or by spraying the solution onto a heated drum, or by substantially any conventional means.

(8) Heating the dried monocarboxylate mixture to convert the monocarboxylates to oxide, thereby forming a homogeneous mixture of the oxides of Ca, Ba, and Cu.

(9) Intimately admixing the oxide mixture of (8) with $Tl_2O_3$ to provide an atomic ratio of $Tl_a$-$Ca_b$-$Ba_c$-$Cu_d$-O where a, b, c, and d are as above defined.

(10) Calcining the oxide mixture of (9) to form a superconductor.

Although we used acetates in our examples, actually any of the lower monocarboxylates are suitable, i.e., formates, propionates, or butyrates. Further, mixtures of these salts are useful, e.g., a mixture of calcium acetate, barium formate, and copper propionate; or a mixture of calcium formate, barium propionate, and copper acetate, etc. The permutative possibilities are numerous and are not critical.

Also, instead of water, the solvent may be a lower monohydroxyalkanol (1–4 carbons), e.g., ethanol. For economic reasons we prefer the acetates in water solvent.

Preferably, we spray-dry our monocarboxylate solution. The spray-dried product is a powder and does not require grinding. The spray-dried product is calcined to a mixed oxide and this is mixed with $Tl_2O_3$ powder. In this way no grinding at any stage is required. The powdered (Ca-Ba-Cu)oxide-$Tl_2O_3$ mixture can be taken directly to the furnace and fired to convert the Tl-Ca-Ba-Cu oxide mix to a superconducting powder. As will be evident from this technique, not only is the $Tl_2O_3$ not heated as the monocarboxylate—it is not heated at all until it is in proper stoichiometric oxide-admixture with the Ca-Ba-Cu oxide mixture.

Our invention thus offers at least three closely related contributions to the art: (1) total homogeneity of the Ca-Ba-Cu oxides; (2) minimal handling of toxic Tl; (3) zero Tl loss during calcining and therefore better control of stoichiometry; and (4) minimal introduction of impurities. Our preferred use of acetates in water as above described avoids grinding and the introduction of impurities resulting from grinding. Our actual examples involve some grinding, but only on a small lab scale, and without introduction of sufficient impurities to destroy superconductivity. In these examples we have two grinding steps, the first being the step of grinding the dried acetate mixture, and the second being grinding thallium oxide with the calcined Ca-Ba-Cu oxide. However, the sum of these grinding steps is less than the art practice of starting with all oxides and/or carbonates, since in our process Ca, Ba, and Cu are already completely and homogeneously mixed at the outset.

We use the term "homogeneous" to mean dispersion so fine that it is practically at the atomic level. This is the type of homogeneity that results when our acetate solution is dried and calcined. Subsequent admixture with $Tl_2O_3$, even with repeated grinding, does not give the same degree or type of dispersion. It is known of course that such mixing and grinding is operative, both in the prior art as well as in our invention (cf. Example 3). It does, however, tend to introduce traces of impurities.

The following examples illustrate without limiting our invention.

EXAMPLE 1

Preparation of Mixed Acetates $CaCO_3$ (20.0 g) was dissolved in an acetic acid solution (70 g of glacial acetic acid in 850 g distilled $H_2O$). $BaCO_3$ (39.5 g) was then dissolved in the above solution. Cupric acetate monohydrate (59.9 g) was dissolved in the above solution with an additional 50 g of distilled $H_2O$. The solution was dried in glass trays in an oven at 150° (16 hours).

EXAMPLE 2

Preparation of $Ca_2Ba_2Cu_3$ Oxides

The dried product of Example 1 was ground with a mortar and pestle, and then calcined at 500° C. (8 hours). The product was a soft, easily ground, grey powder. The weight loss was 40.1%.

EXAMPLE 3

Preparation of Thallium Barium Calcium Copper Oxide Superconducting Powder

The calcined product of Example 2 (10.0 g) was mixed with $Tl_2O_3$ (7.0 g) with a mortar and pestle. The mixed powder was placed in an alumina boat, fired to 850° C., and held at this temperature for 5 hours. The resulting black powder was pressed into a pellet, which, when cooled in liquid nitrogen, repelled a magnet, thus showing the Meissner effect and indicating superconductance. Total weight loss in this step was 35.8%.

EXAMPLE 4

Pelletizing Tl-Ca-Ba-Cu Oxide Powder

Powder prepared as in Example 3 (8.57 g) was pressed into a 1⅛" diameter disk-pellet at 4,000 psi. The disk was placed in a tube furnace under flowing $O_2$ and heated to 850° C. in 4 hours and 10 minutes. The sample was held at 865° C. for 6 hours, and then cooled to room temperature in 12 hours. The weight loss was 4.1%. Thd disk floated a rare earth magnet (ca. 3.6 g) in liquid nitrogen. The $T_c$ was found to be 114° K. on cooling and 125° K. on heating.

Powders resulting from these operations are suitably about 100-mesh (i.e., about 90% will pass a 100-mesh U.S. Screen). The powder mixture can be formed into a pellet or other shape by compression or other conventional techniques. The pellets in our work were made with a Carver laboratory hydraulic press, and were about ½–1" in diameter and ¼" in height. These dimensions are of course not critical.

From the foregoing description it will be evident that our process introduces no extraneous substances into the system; viz., no cations other than Tl, Ca, Ba, and Cu enter the system. The process thus results in an oxide mix of extraordinary purity at all stages, from initial powder mixture to finished powder or other shape.

Extraneous Materials

Prior art processes conventionally enhance homogeneity by grinding the calcined intended superconductor, followed by recalcining. In some instances this sequence may be repeated several times. It is known that improved homogeneity in the general case enhances super-conductivity. The problem here is that effective grinding inevitably and inherently introduces impurities into the ceramic, simply by impacting the ceramic between the balls and walls (or other grinding surfaces) of the grinding mill. It is known, for example, that silica or stainless steel balls in a ball mill lose significant mass over a period of use. This mass of course disappears into whatever was being milled. Mills that comminute by particle self-impact lose metal by wall-scouring, particularly in the area of stream entry. If the product is ground in a ball mill using quartz or silica balls, some of the impurity is silica.

Thus, the firing-grinding-refiring technique rapidly achieves a balance: Improvement in homogeneity tends to be matched by contamination build-up that cancels part or all of the improvement.

As above described, our process minimizes the grinding problem in the general case. Our heat-treated product can of course by subjected to the conventional grinding-shaping-refiring cycle, but this is superfluous.

Levitation Test for Superconductivity

Various tests are available for the determination of superconductivity. One of these tests is conventional, simple, and is accepted in the art as definitive. We used this, the so-called levitation test, in our determinations, and we describe it below.

The powder of Example 3 or 4 is pelletized as above described, and the pellet is placed in the center of a glass dish. Liquid nitrogen (77° K.) is poured into the dish. The pellet bubbles a bit at first, as the nitrogen boils on contact, and as surface air is flushed from the pellet. In a few minutes gas evolution diminishes to nearly zero, and the pellet may be assumed to be chilled to approximately the temperature of liquid nitrogen. A chip of a rare earth magnet is now dropped gently over the pellet. If the magnet levitates, i.e., hovers in the air over the pellet—the so-called "Meissner Effect"—the pellet is superconducting.

We claim:

1. Process comprising the sequential steps of:
   (A) preparing a pre-mix comprising dissolving monocarboxylates of Ca, Ba, and Cu in water or in a monohydroxy alkanol of 1-4 carbons to provide about 5-25 weight % monocarboxylates in the solution; the Ca, Ba, and Cu being present in amounts to provide an atomic ratio of $Ca_b$-$Ba_c$-$Cu_d$, where b is about 0.5-3; c is about 0.5-3; and d is about 1-4; the monocarboxylate being formate, acetate, propionate, or butyrate;
   (B) drying the monocarboxylate solution of (A), thereby to provide a dry homogeneous monocarboxylate mixture;
   (C) heating the dry mixture of (B) to convert the monocarboxylates to the oxides, thereby forming a homogeneous mixture of the oxides of Ca, Ba, and Cu;
   (D) admixing the oxide mixture of (C) with $Tl_2O_3$ in an amount to provide an atomic ratio of $Tl_a$-$Ca_b$-$Ba_c$-$Cu_d$ where a is about 0.5-3 and b, c, and d are as defined in (A); and
   (E) heating the oxide mixture of (D) to form a superconductor.

2. Process according to claim 1 wherein the monocarboxylate is acetate and the solvent is water.

3. Process according to claim 1 wherein a is 2, b is 2, c is 2, and d is 3.

* * * * *